(12) United States Patent
Foote et al.

(10) Patent No.: US 7,172,973 B1
(45) Date of Patent: Feb. 6, 2007

(54) SYSTEM AND METHOD FOR SELECTIVELY MODIFYING A WET ETCH RATE IN A LARGE AREA

(75) Inventors: Richard W. Foote, Kennedale, TX (US); William M. Coppock, Arlington, TX (US); Victor M. Torres, Irving, TX (US); Terry Lines, Arlington, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 138 days.

(21) Appl. No.: 10/979,622

(22) Filed: Nov. 2, 2004

(51) Int. Cl.
*H01L 21/302* (2006.01)
(52) U.S. Cl. ...................... 438/706; 438/745
(58) Field of Classification Search ............ 438/706, 438/710, 714, 723, 725, 745, 753, 756, 401, 438/423
See application file for complete search history.

(56) References Cited

U.S. PATENT DOCUMENTS

| | | | | |
|---|---|---|---|---|
| 5,118,636 | A * | 6/1992 | Hosaka | 438/421 |
| 5,401,691 | A * | 3/1995 | Caldwell | 438/633 |
| 6,037,671 | A * | 3/2000 | Kepler et al. | 257/797 |
| 6,362,040 | B1 * | 3/2002 | Tews et al. | 438/246 |
| 6,440,816 | B1 * | 8/2002 | Farrow et al. | 438/401 |
| 6,596,642 | B2 * | 7/2003 | Wu et al. | 438/705 |
| 6,664,602 | B2 * | 12/2003 | Yamashita et al. | 257/371 |
| 2005/0023708 | A1 * | 2/2005 | Chen et al. | 257/797 |

FOREIGN PATENT DOCUMENTS

JP        02-018943        * 1/1990

OTHER PUBLICATIONS

Neil Henis et al., "Shadowing of Lightly-Doped Drain Implants Due to Gate Etch Profiles and Implanter Configurations", SPIE, vol. 2875, pp. 169-177, no date avail.
David Abercrombie et al., "Managing Implant Shadowing", Semiconductor International, Sep. 1996, pp. 107-109.
Hung-Sheng Chen et al., "ION Beam Shadowing Effect in Submicrometer Large-Angle-Tilt Implanted Drain (LATID) MOSFETs", Solid-State Electronics, vol. 38, No. 7, pp. 1321-1323, 1995.
C. T. Chuang et al., "On the Sidewall Shadowing Effect of Advanced Self-Aligned Bipolar Transistors", IEEE 1987, pp. 24-26.

(Continued)

*Primary Examiner*—Kin-Chan Chen

(57) ABSTRACT

A system and method is disclosed for selectively increasing a wet etch rate of a large raised area portion of a semiconductor wafer with respect to a wet etch rate of a small raised area portion of the semiconductor wafer. A resist mask on the semiconductor wafer is etched to create a large via over the large raised area portion and a small via over the small raised area portion. An ion implantation beam is applied with an impact direction that enables ions to pass through the large via but does not enable ions to pass through the small via. The ions that pass through the large via increase the wet etch rate of the underlying portion of the semiconductor wafer. In one embodiment the impact direction has a tilt angle of forty five degrees and a rotation angle of forty five degrees.

21 Claims, 4 Drawing Sheets

OTHER PUBLICATIONS

T. Y. Chan et al., "Asymmetrical Characteristics in LDD and Minimum-Overtap MOSFET's", IEEE Electron Device Letters, vol. EDL-7, No. 1, Jan. 1986, pp. 16-19.

Ching-Te Chuang et al., "Effect of Off-Axis Implant on the Characteristics of Advanced Self-Aligned Bipolar Transistors", IEEE Electron Device Letters, vol. EDL-8, No. 7, Jul. 1987, pp. 321-323.

* cited by examiner

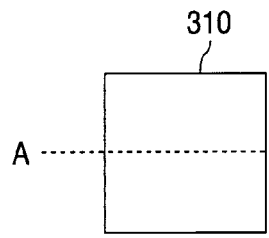
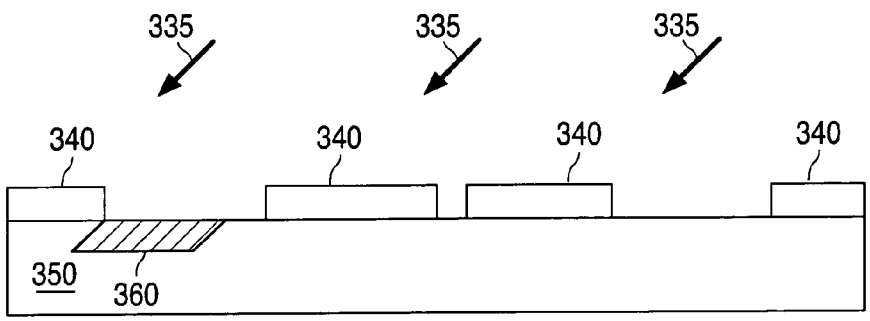
FIG. 3A
FIG. 3B
IMPLANT 45° TILT 45° ROTATION
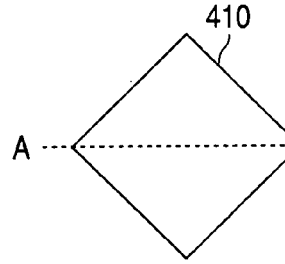
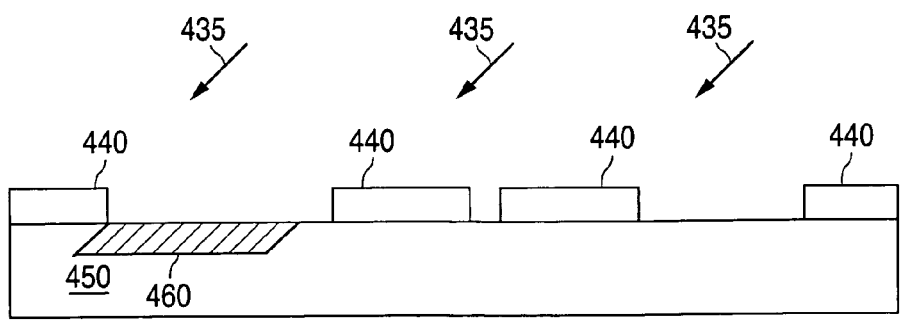
FIG. 4A
FIG. 4B
IMPLANT 45° TILT 45° ROTATION

SYSTEM AND METHOD FOR SELECTIVELY MODIFYING A WET ETCH RATE IN A LARGE AREA

TECHNICAL FIELD OF THE INVENTION

The present invention is generally directed to the manufacture of integrated circuits for semiconductor devices and, in particular, to a system and method for selectively modifying a wet etch rate in a large area.

BACKGROUND OF THE INVENTION

In semiconductor manufacturing chemical mechanical polishing (CMP) is commonly used to planarize dielectric layers between conducting layers. The rate of chemical mechanical polishing (CMP) is dependent upon the relative density of raised areas versus lower areas within a die or within an area of a wafer. An area with a large amount of raised area and a small amount of lower area will polish more slowly than an area with a small amount of raised area and a large amount of lower area.

One type of area with a large amount of raised area and a small amount of lower area is the stepper alignment mark area. In order for the steppers to be able to find the alignment marks, the alignment marks can not be planarized at the chemical mechanical polishing (CMP) step, or if they are, the planarized dielectric must be removed before an opaque film (e.g., polysilicon or metal) is placed on top of the planar dielectric.

In one prior art approach a photoresist mask and etch procedure is performed to remove the dielectric layer from selected structures before the opaque layer is deposited. The alignment marks may be opened during this step. However, because the chemical mechanical polishing (CMP) polish rate is slower, the dielectric thickness over the alignment mark area is thicker than the dielectric thickness over the active circuit components. Therefore, the etch time must be increased. However, increasing a dry etch time can lead to plasma damage or to etching through layers under the dielectric layer. Increasing a wet etch time can lead to undesirable lateral etching and lateral growth of structures or to resist lifting.

In another prior art approach the alignment marks are masked and etched separately. This approach adds cost to the wafer manufacturing process and decreases the overall factory capacity by taxing the lithography equipment (i.e., a factory capacity constraint tool).

In another prior art approach a built in shadow mask is used in the opaque film deposition tool. This approach requires changes to the alignment mark locations. This approach also requires modifications to be made to expensive capital equipment.

Therefore, there is a need in the art for a system and method that is capable of selectively increasing an etch rate in areas that have a large amount of raised area (e.g., alignment marks) without increasing the etch rate in areas that have a small amount of raised area (e.g., the active device regions).

SUMMARY OF THE INVENTION

To address the above-discussed deficiencies of the prior art, it is a primary object of the present invention to provide a system and method for selectively increasing the wet etch rate in areas that have a large amount of raised area without increasing the wet etch rate in areas that have a small amount of raised area.

Implanting medium to high doses of large ions into an oxide layer without a subsequent thermal anneal significantly increases the wet etch rate of the oxide layer in the implant area. Chemical mechanical polishing (CMP) is often used to planarize the dielectric layers before the contact mask and etch procedures and the via mask and etch procedures.

All of the active contacts and vias usually have at least one fixed length lateral dimension that is perpendicular to the depth of the active contacts and vias. Often all of the active contacts and vias have two fixed length lateral dimensions that are perpendicular to the depth of the active contacts and vias.

For example, if one via is one half micron (0.5 µm) in width, then all of the vias will be one half micron (0.5 µm) in width. It is often the case that if the vias are one half micron (0.5 µm) in width, then the vias are also one half micron (0.5 µm) in length. Sometimes instead of a square shape contacts and vias may have a rectangular shape. However, all of the contacts and vias will have the same width regardless of the length of a particular contact or via. Maintaining a constant width size for the contacts and vias helps to avoid problems with aspect ratio dependent etching and with the metal fill procedures for filling the contacts and vias.

The typical size of an alignment mark, however, is very much larger than the size of the active contacts or vias. The areas that have a large amount of raised area (e.g., alignment marks) are usually square in order to minimize problems with aspect ratio etching and in order to minimize problems with metal fill procedures.

If the direction of the ion implantation beam is tilted by a large acute angle (e.g., forty five degrees) the implantation ions will not reach the bottom of a via if the width of the via is less than the thickness of the resist mask layer.

In one advantageous embodiment of the present invention, a resist mask is placed on the surface of a semiconductor wafer. The resist mask is then etched to create a large via over a large raised area portion and a small via over a small raised area portion. An ion implantation beam is then aligned with an impact direction that enables the implantation ions to pass through the large via but does not enable implantation ions to pass through the small via. The implantation ions that pass through the large via increase the wet etch rate of the underlying large raised area portion of the semiconductor wafer. Because the implantation ions do not pass through the small via the wet etch rate of the underlying small raised area portions is unchanged.

If the impact direction of the ion implantation beam is tilted at a large acute angle (e.g., forty five degrees) the implantation ions will not reach the bottom of a small via in the semiconductor wafer if the width of the small via is less than the thickness of the resist mask layer.

It is an object of the present invention to provide a system and method for selectively increasing the wet etch rate in areas that have a large amount of raised area without increasing the wet etch rate in areas that have a small amount of raised area.

It is also an object of the present invention to provide a system and method for selectively increasing the wet etch rate in alignment mark areas of a semiconductor wafer.

It is yet another object of the present invention to provide a system and method for aligning an ion implantation beam with respect to a semiconductor wafer so that the implantation ions will not reach the bottom of a via in the semiconductor wafer if the width of the via is less than the thickness of a resist mask layer on the semiconductor wafer.

It is another object of the present invention to provide a system and method for aligning an ion implantation beam with respect to a semiconductor wafer with an implant direction that has an acute tilt angle and an acute rotation angle.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts:

FIG. 3A illustrates a schematic representation of a plan view of an align mark via, a single via and a slot via to which an implant is applied having a forty five degree tilt and a forty five degree rotation;

FIG. 3B illustrates a cross sectional view of the align mark via, the single via, and the slot via taken along line A—A shown in FIG. 3A;

FIG. 4A illustrates a schematic representation of a plan view of an align mark via, a single via and a slot via to which an implant is applied having a forty five degree tilt and a forty five degree rotation and in which the align mark via, the single via, and the slot via are disposed at a forty five degree angle to the implant direction;

FIG. 4B illustrates a cross sectional view of the align mark via, the single via, and the slot via taken along line A—A shown in FIG. 4A;

DETAILED DESCRIPTION OF THE INVENTION

FIGS. 1 through 6 and the various embodiments used to describe the principles of the present invention in this patent document are by way of illustration only and should not be construed in any way to limit the scope of the invention. Those skilled in the art will understand that the principles of the present invention may be implemented in any type of suitably arranged semiconductor circuit.

Figure 1A:
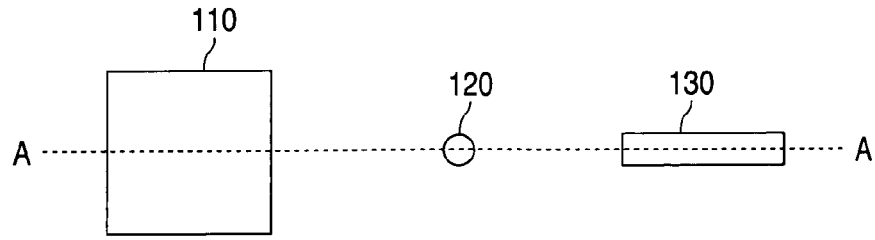
FIG. 1A illustrates a schematic representation of a plan view of an align mark via, a single via and a slot via to which an implant is applied having a zero degree tilt and a zero degree rotation.

FIG. 1A illustrates a schematic representation of a plan view of an align mark via 110, a single via 120 and a slot via 130 to which an implant is applied that has a zero degree tilt and a zero degree rotation. The tilt angle is measured with respect to a line (not shown) that is perpendicular to the plane of the semiconductor wafer (i.e., the plane of the paper in FIG. 1A). The rotation angle is measured with respect to the line A—A in FIG. 1A. In the case illustrated in FIG. 1A and in FIG. 1B the tilt angle is zero degrees and the rotation angle is zero degrees.

Figure 1B:
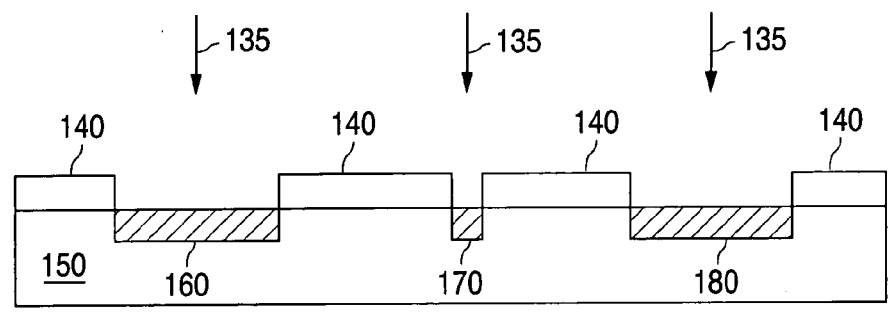
FIG. 1B illustrates a cross sectional view of the align mark via, the single via, and the slot via taken along line A—A shown in FIG. 1A.

FIG. 1B illustrates a cross sectional view of the align mark via 110, the single via 120, and the slot via 130 taken along line A—A shown in FIG. 1A. The downwardly pointing arrows 135 in FIG. 1B represent the implant direction of zero degrees tilt and zero degrees rotation. The resist mask layer is designated with reference numeral 140 and the underlying portions of the semiconductor wafer are designated with reference numeral 150.

As shown in FIG. 1B, the implant procedure implants the semiconductor wafer portion 160 through the align mark via 110. The implant procedure also implants the semiconductor wafer portion 170 through the single via 120. The implant procedure also implants the semiconductor wafer portion 180 through the slot via 130. When the implant direction has a zero degree tilt and a zero degree rotation the implant passes vertically through the align mark via 110, and passes vertically through the single via 120, and passes vertically through the slot via 130.

Figure 2A:
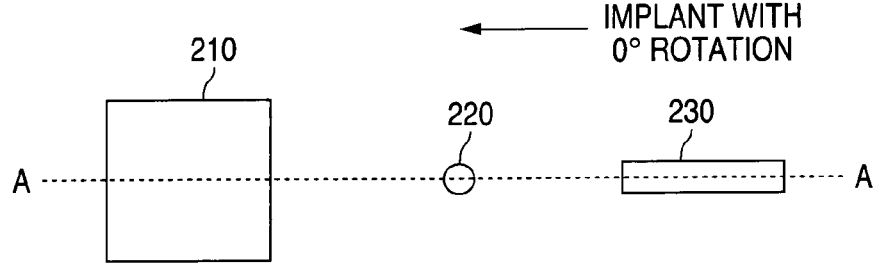
FIG. 2A illustrates a schematic representation of a plan view of an align mark via, a single via and a slot via to which an implant is applied having a forty five degree tilt and a zero degree rotation.

FIG. 2A illustrates a schematic representation of a plan view of an align mark via 210, a single via 220 and a slot via 230 to which an implant is applied having a forty five degree tilt and a zero degree rotation angle. The tilt angle is measured with respect to a line (not shown) that is perpendicular to the plane of the semiconductor wafer (i.e., the plane of the paper in FIG. 2A). The rotation angle is measured with respect to the line A—A in FIG. 2A. In the case illustrated in FIG. 2A and in FIG. 2B the tilt angle is forty five degrees and the rotation angle is zero degrees.

Figure 2B:
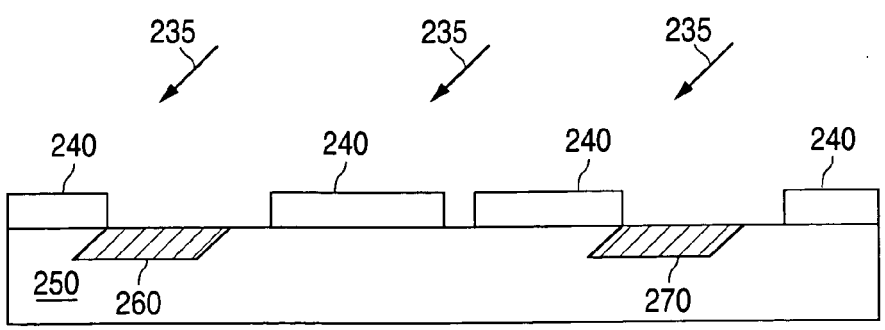
FIG. 2B illustrates a cross sectional view of the align mark via, the single via, and the slot via taken along line A—A shown in FIG. 2A.

FIG. 2B illustrates a cross sectional view of the align mark via 210, the single via 220, and the slot via 230 taken along line A—A shown in FIG. 2A. The downwardly angled arrows 235 in FIG. 2B represent the implant direction of forty five degrees tilt and zero degrees rotation. The resist mask layer is designated with reference numeral 240 and the underlying portions of the semiconductor wafer are designated with reference numeral 250.

As shown in FIG. 2B, the implant procedure implants the semiconductor wafer portion 260 through the align mark via 210. Note that the forty five degree tilt angle causes the implanted area 260 to have edges that are tilted at approximately forty five degrees. The portions of the semiconductor wafer 250 that are located at the right hand side of the align mark via 210 are not implanted because they are shielded by portions of the resist mask layer 240.

The implant procedure also implants the semiconductor wafer portion 270 through the slot via 230. Note that the forty five degree tilt angle causes the implanted area 270 to have edges that are tilted at approximately forty five degrees. The portions of the semiconductor wafer 250 that are located at the right hand side of the slot via 230 are not implanted because they are shielded by portions of the resist mask layer 240.

Note that implantation ions of the implant procedure do not pass through the single via 220 to the bottom of the single via 220. This is because the portions of the semiconductor wafer 250 that are located at the bottom of the single via 220 are shielded by portions of the resist mask layer 240.

When the implant direction has a forty five degree tilt and a zero degree rotation the implant passes in an angled direction down through the align mark via 210, and passes in an angled direction down through the slot via 230, but does not pass through the single via 220. The implant is able to pass in an angled direction down through the slot via 230 because when there is a rotation angle of zero degrees the length of the slot via 230 is aligned with the implant direction.

When the implant direction has a forty five degree tilt and a zero degree rotation the implantation ions of the implant procedure will not reach the bottom of the single via 220 as long as the width of the single via 220 is less than or equal to the square root of two times the thickness of the resist mask layer 240.

FIG. 3A illustrates a schematic representation of a plan view of an align mark via 310, a single via 320 and a slot via 330 to which an implant is applied having a forty five degree tilt and a forty five degree rotation angle. The tilt angle is measured with respect to a line (not shown) that is perpendicular to the plane of the semiconductor wafer (i.e., the plane of the paper in FIG. 3A). The rotation angle is measured with respect to the line A—A in FIG. 3A. In the case illustrated in FIG. 3A and in FIG. 3B the tilt angle is forty five degrees and the rotation angle is forty five degrees.

FIG. 3B illustrates a cross sectional view of the align mark via 310, the single via 320, and the slot via 330 taken along line A—A shown in FIG. 3A. The downwardly angled arrows 335 in FIG. 3B represent the implant direction of forty five degrees tilt and forty five degrees rotation. The downwardly angled arrows 335 are shown with an enhanced thickness to signify that they are both tilted at forty five degrees and rotated at forty five degrees. The resist mask layer is designated with reference numeral 340 and the underlying portions of the semiconductor wafer are designated with reference numeral 350.

As shown in FIG. 3B, the implant procedure implants the semiconductor wafer portion 360 through the align mark via 310. Note that the forty five degree tilt angle causes the implanted area 360 to have edges that are tilted at approximately forty five degrees. The portions of the semiconductor wafer 350 that are located at the right hand side of the align mark via 310 are not implanted because they are shielded by portions of the resist mask layer 340.

Note that implantation ions of the implant procedure do not pass through the single via 320 to the bottom of the single via 320. This is because the portions of the semiconductor wafer 350 that are located at the bottom of the single via 320 are shielded by portions of the resist mask layer 340.

Also note that the implantation ions of the implant procedure do not pass through the slot via 330 to the bottom of the slot via 330. This is because the portions of the semiconductor wafer 350 that are located at the bottom of the slot via 330 are shielded by portions of the resist mask layer 340.

When the implant direction has a forty five degree tilt and a forty five degree rotation the implant passes in an angled direction down through the align mark via 310, but does not pass through the single via 320 or through the slot via 330. The implant is not able to pass in an angled direction down through the slot via 330 because when there is a rotation angle of forty five degrees the length of the slot via 330 is not aligned with the implant direction.

When the implant direction has a forty five degree tilt and a forty five degree rotation the implantation ions of the implant procedure will not reach the bottom of the single via 320 as long as the width of the single via 320 is less than or equal to the square root of two times the thickness of the resist mask layer 340. Similarly, when the implant direction has a forty five degree tilt and a forty five degree rotation the implantation ions of the implant procedure will not reach the bottom of the slot via 330 as long as the width of the slot via 330 is less than or equal to the square root of two times the thickness of the resist mask layer 340.

FIG. 4A illustrates a schematic representation of a plan view of an align mark via 410, a single via 420 and a slot via 430 to which an implant is applied having a forty five degree tilt angle and a forty five degree rotation angle. In the arrangement shown in FIG. 4A the align mark via 410, the single via 420, and the slot via 430 are disposed at a forty five degree angle to the line A—A. FIG. 4B illustrates a cross sectional view of the align mark via 410, the single via 420, and the slot via 430 taken along line A—A shown in FIG. 4A.

The arrangement shown in FIG. 4A and in FIG. 4B is functionally equivalent to the arrangement shown in FIG. 3A and in FIG. 3B. The differences are (1) the implant direction having a forty five degree rotation angle is parallel to the line A—A, and (2) the align mark via 410, the single via 420, and the slot via 430 are disposed at a forty five degree angle to the line A—A.

As before, the tilt angle is measured with respect to a line (not shown) that is perpendicular to the plane of the semiconductor wafer (i.e., the plane of the paper in FIG. 4A). The rotation angle is measured with respect to the line A—A in FIG. 4A. In the case illustrated in FIG. 4A and in FIG. 4B the tilt angle is forty five degrees and the rotation angle is forty five degrees (because the vias 410, 420, 430 are disposed at a forty five degree angle to the line A—A).

FIG. 4B illustrates a cross sectional view of the align mark via 410, the single via 420, and the slot via 430 taken along line A—A shown in FIG. 4A. The downwardly angled arrows 435 in FIG. 3B represent the implant direction of forty five degrees tilt and forty five degrees rotation. The downwardly angled arrows 435 are shown with a normal thickness to signify that they are tilted at forty five degrees.

The resist mask layer is designated with reference numeral 440 and the underlying portions of the semiconductor wafer are designated with reference numeral 450.

As shown in FIG. 4B, the implant procedure implants the semiconductor wafer portion 460 through the align mark via 410. Note that the forty five degree tilt angle causes the implanted area 460 to have edges that are tilted at approximately forty five degrees. The portions of the semiconductor wafer 450 that are located at the right hand side of the align mark via 410 are not implanted because they are shielded by portions of the resist mask layer 440.

Note that implantation ions of the implant procedure do not pass through the single via 420 to the bottom of the single via 420. This is because the portions of the semiconductor wafer 450 that are located at the bottom of the single via 420 are shielded by portions of the resist mask layer 440.

Also note that the implantation ions of the implant procedure do not pass through the slot via 430 to the bottom of the slot via 430. This is because the portions of the semiconductor wafer 450 that are located at the bottom of the slot via 430 are shielded by portions of the resist mask layer 440.

When the implant direction has a forty five degree tilt and a forty five degree rotation the implant passes in an angled direction down through the align mark via 410, but does not pass through the single via 420 or through the slot via 430. The implant is not able to pass in an angled direction down through the slot via 430 because when there is a rotation angle of forty five degrees the length of the slot via 430 is not aligned with the implant direction.

When the implant direction has a forty five degree tilt and a forty five degree rotation the implantation ions of the implant procedure will not reach the bottom of the single via 420 as long as the width of the single via 420 is less than or equal to the square root of two times the thickness of the resist mask layer 440. Similarly, when the implant direction has a forty five degree tilt and a forty five degree rotation the implantation ions of the implant procedure will not reach the bottom of the slot via 430 as long as the width of the slot via 430 is less than or equal to the square root of two times the thickness of the resist mask layer 440.

Figure 5:
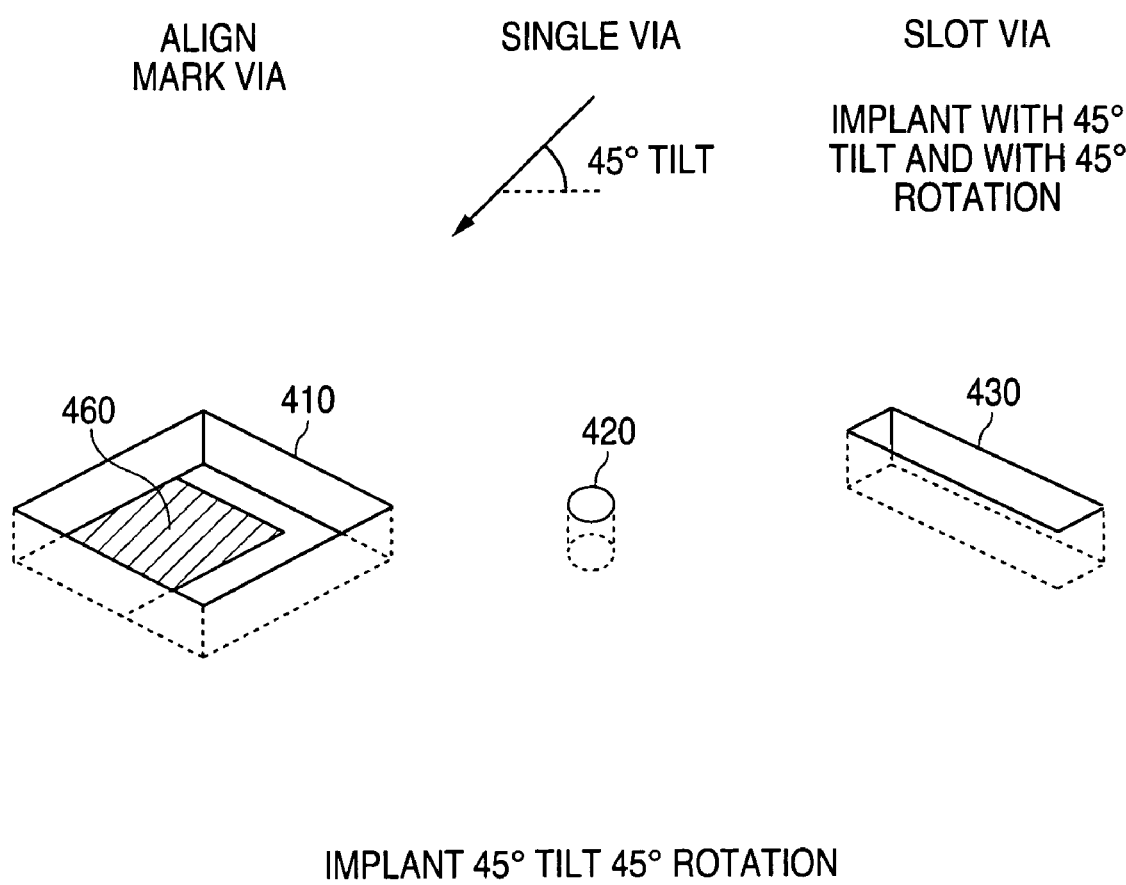
FIG. 5 illustrates a schematic representation of perspective view of the align mark via, the single via and the slot via shown in FIG. 4A and in FIG. 4B.

FIG. 5 illustrates a schematic representation of perspective view of the align mark via 410, the single via 420 and the slot via 430 shown in FIG. 4A and in FIG. 4B. The dotted portions of align mark via 410, single via 420 and slot via 430 show their extension through the resist mask layer (not shown in FIG. 5). The implant procedure implants the semiconductor wafer portion 460 through the align mark via 410. The portions of the semiconductor wafer that are located at the right hand side of the align mark via 410 are not implanted because they are shielded by portions of the resist mask layer (not shown in FIG. 5).

FIG. 5 illustrates that when an implant direction has a forty five degree tilt and a forty five degree rotation the implant passes in an angled direction down through a large via (such as align mark via 410) but not through small vias (such as single via 420 and slot via 430). This feature enables the selective implantation of semiconductor wafer portions that are located at the bottom of large vias without the implantation of semiconductor wafer portions that are located at the bottom of small vias.

Although the examples given above use an acute angle of forty five degrees, the value of forty five degrees is merely illustrative. That is, the invention is not limited to the use of a forty five degree angle. An acute angle that is greater than forty five degrees or that is less than forty five degrees may also be used in accordance with the principles of the present invention.

Figure 6:
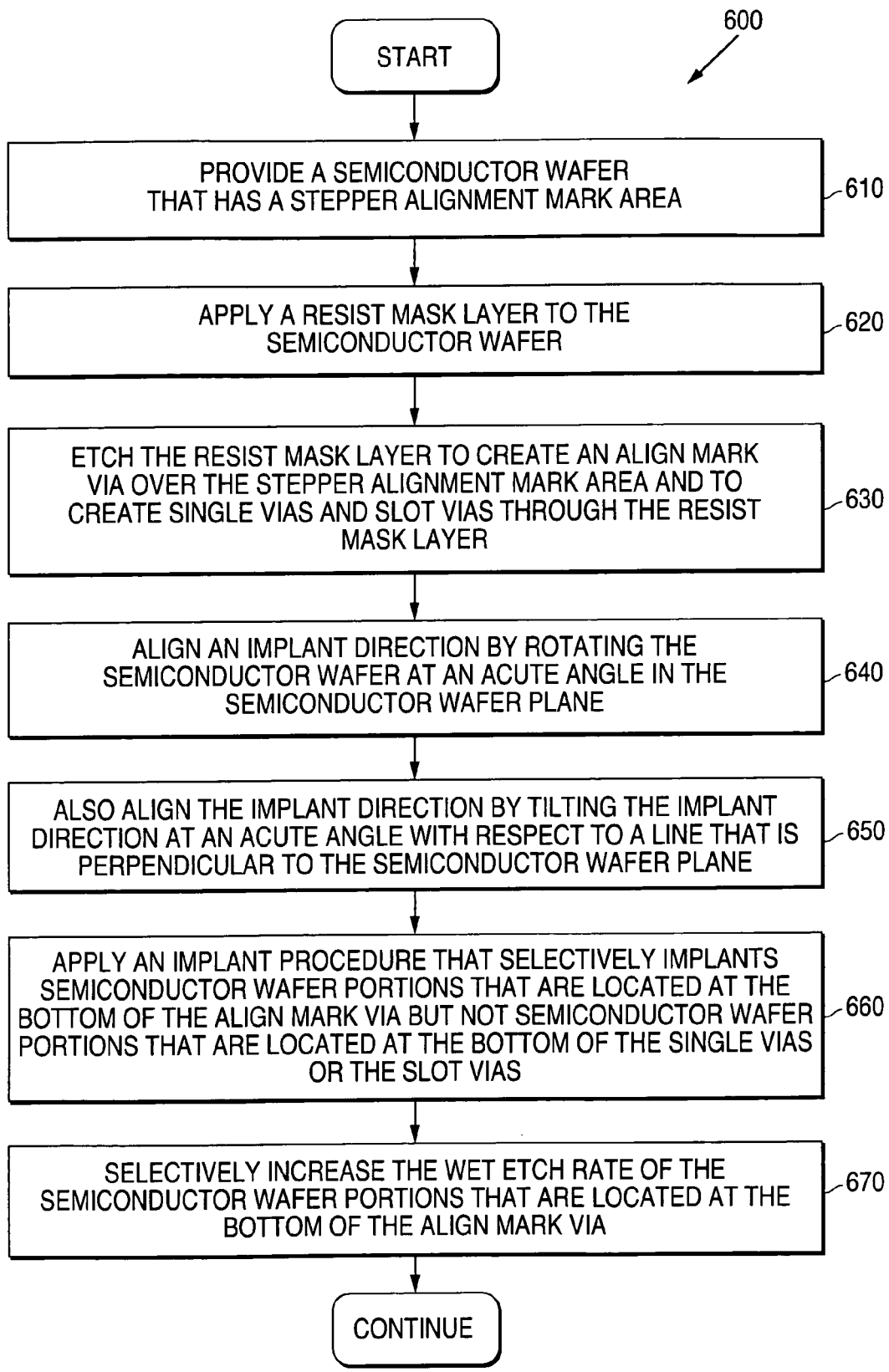
FIG. 6 illustrates a flow chart showing the steps of an advantageous embodiment of the method of the present invention.

FIG. 6 illustrates a flow chart showing the steps of an advantageous embodiment of the method of the present invention. The steps of the invention are collectively designated with reference numeral 600. In the first step, a semiconductor wafer is provided that has a stepper alignment mark area (step 610). A resist mask layer is then applied to the semiconductor layer (step 620). Then the resist mask layer is etched to create an align mark via over the stepper alignment mark area and to create single vias and slot vias through the resist mask layer (step 630).

Then an implant direction for an implantation procedure is aligned by rotating the semiconductor wafer at an acute angle in the semiconductor wafer plane (step 640). The implant direction is also aligned by tilting the implant direction at an acute angle with respect to a line that is perpendicular to the semiconductor wafer plane (step 650).

Then an implant procedure is applied that selectively implants semiconductor wafer portions that are located at the bottom of the align mark via but not semiconductor wafer portions that are located at the bottom of single vias or at the bottom of slot vias (step 660). The implant procedure selectively increases the wet etch rate of the semiconductor wafer portions that are located at the bottom of the align mark via (step 670).

In this manner the effective wet etch rate of an area of the semiconductor wafer that has a large amount of raised area ("large raised area portion") may be increased with respect to the wet etch rate of areas of the semiconductor wafer that have a small amount of raised area ("small raised area portion"). A subsequent wet etch process applied to the semiconductor wafer will therefore etch the large raised area portions more quickly than the small raised area portions. Because the large raised area portions have more oxide material than the small raised area portions, the wet etch process will etch more oxide material in the large raised area portions due to the increased wet etch rate of the large raised area portions.

The creation of an increased wet etch rate for the large raised area portions of the semiconductor wafer makes it possible to etch both the large raised area portions and the small raised area portions of the semiconductor wafer at the same time. There is no need to etch the large raised area portions and the small raised area portions of the semiconductor wafer separately with two etch steps.

Although the present invention has been described with an exemplary embodiment, various changes and modifications may be suggested to one skilled in the art. It is intended that the present invention encompass such changes and modifications as fall within the scope of the appended claims.

The invention claimed is:

1. A method for selectively increasing a wet etch rate of a large raised area portion of a semiconductor wafer with respect to a wet etch rate of a small raised area portion of the semiconductor wafer, said method comprising the steps of:

applying a resist mask layer to said semiconductor wafer;

etching said resist mask layer to create a large via over said large raised area portion of said semiconductor wafer;

etching said resist mask layer to create a small via over said small raised area portion of said semiconductor wafer; and exposing said semiconductor wafer to ions of an ion implantation beam that has an implant direction that enables ions to pass through said large via but does not enable ions to pass through said small via.

2. The method as set forth in claim 1 wherein said implant direction of said ion implantation beam is tilted at an acute angle with respect to a line that is perpendicular to the plane of the semiconductor wafer.

3. The method as set forth in claim 2 wherein said acute angle of tilt is an angle of forty five degrees.

4. The method as set forth in claim 2 wherein said implant direction of said ion implantation beam is rotated at an acute angle in the semiconductor wafer plane.

5. The method as set forth in claim 4 wherein said acute angle of rotation is an angle of forty five degrees.

6. The method as set forth in claim 4 wherein said large raised area portion of said semiconductor wafer comprises an alignment mark area and said large via comprises an align mark via.

7. The method as set forth in claim 6 wherein said small raised area portion of said semiconductor wafer comprises an active device area and said small via comprises one of: a single via and a slot via.

8. The method as set forth in claim 7 wherein said implant direction of said ion implantation beam is tilted at an acute angle with respect to a line that is perpendicular to the plane of the semiconductor wafer and rotated at an acute angle in the semiconductor wafer plane so that ions pass through said align mark via but do not pass through one of: said single via and said slot via.

9. The method as set forth in claim 8 wherein said angle of tilt is an angle of forty five degrees and said angle of rotation is an angle of forty five degrees.

10. The method as set forth in claim 8 further comprising the step of:
applying a wet etch process to said large raised area portion of said semiconductor wafer that has been exposed to said ion implantation process and to said small raised area portion of said semiconductor wafer that has not been exposed to said ion implantation process.

11. The method as set forth in claim 7 wherein said implant direction of said ion implantation beam is tilted at an acute angle with respect to a line that is perpendicular to the plane of the semiconductor wafer; and
wherein said align mark via and said one of said single via and said slot via are disposed at an acute angle in the semiconductor wafer plane with respect to said implant direction of said ion implantation beam so that ions pass through said align mark via but do not pass through one of said single via and said slot via.

12. The method as set forth in claim 11 wherein said angle of tilt is an angle of forty five degrees and said angle at which said align mark via and said one of said single via and said slot via are disposed is an angle of forty five degrees.

13. The method as set forth in claim 1 wherein said large raised area portion of said semiconductor wafer comprises an alignment mark area and said large via comprises an align mark via.

14. The method as set forth in claim 13 wherein said small raised area portion of said semiconductor wafer comprises an active device area and said small via comprises a single via.

15. The method as set forth in claim 14 wherein said implant direction of said ion implantation beam is tilted at an acute angle with respect to a line that is perpendicular to the plane of the semiconductor wafer so that ions pass through said align mark via but do not pass through said single via.

16. The method as set forth in claim 15 wherein said acute angle of tilt is an angle of forty five degrees.

17. The method as set forth in claim 15 further comprising the step of:
applying a wet etch process to said large raised area portion of said semiconductor wafer that has been exposed to said ion implantation process and to said small raised area portion of said semiconductor wafer that has not been exposed to said ion implantation process.

18. A method for selectively increasing a wet etch rate of an alignment mark area of a semiconductor wafer with respect to a wet etch rate of an active device portion of the semiconductor wafer, said method comprising the steps of:
applying a resist mask layer to said semiconductor wafer;
etching said resist mask layer to create an align mark via over said alignment mark area of said semiconductor wafer;
etching said resist mask layer to create one of a single via and a slot via over said active device portion of said semiconductor wafer; and
exposing said semiconductor wafer to ions of an ion implantation beam that has an implant direction that enables ions to pass through said align mark via but does not enable ions to pass through said one of said single via and said slot via.

19. The method as set forth in claim 18 wherein said implant direction of said ion implantation beam is tilted at an acute angle with respect to a line that is perpendicular to the plane of the semiconductor wafer and rotated at an acute angle in the semiconductor wafer plane so that ions pass through said align mark via but do not pass through one of said single via and said slot via.

20. The method as set forth in claim 19 wherein said angle of tilt is an angle of forty five degrees and said angle of rotation is an angle of forty five degrees.

21. The method as set forth in claim 19 further comprising the step of:
applying a wet etch process to said alignment mark area of said semiconductor wafer that has been exposed to said ion implantation process and to said active device portion of said semiconductor wafer that has not been exposed to said ion implantation process.

* * * * *